(12) United States Patent
Urushihata

(10) Patent No.: US 7,968,983 B2
(45) Date of Patent: Jun. 28, 2011

(54) SEMICONDUCTOR DEVICE

(75) Inventor: Hiroyoshi Urushihata, Gunma (JP)

(73) Assignees: Sanyo Electric Co., Ltd., Osaka (JP);
Sanyo Semiconductor Co., Ltd., Gunma (JP)

( * ) Notice: Subject to any disclaimer, the term of this patent is extended or adjusted under 35 U.S.C. 154(b) by 223 days.

(21) Appl. No.: 11/861,682

(22) Filed: Sep. 26, 2007

(65) Prior Publication Data

US 2008/0251899 A1    Oct. 16, 2008

(30) Foreign Application Priority Data

Apr. 16, 2007   (JP) ................... 2007-107636

(51) Int. Cl.
*H01L 23/495*   (2006.01)
(52) U.S. Cl. ........ 257/676; 257/686; 257/700; 257/723; 257/782; 257/E23.031; 257/E23.037
(58) Field of Classification Search .............. 257/676, 257/782, E23.037, E23.031, 700, 723, 686
See application file for complete search history.

(56) References Cited

U.S. PATENT DOCUMENTS

| | | | |
|---|---|---|---|
| 6,365,979 B1 * | 4/2002 | Miyajima | 257/787 |
| 6,603,197 B1 * | 8/2003 | Yoshida et al. | 257/676 |
| 6,879,037 B2 * | 4/2005 | Wada et al. | 257/723 |
| 2002/0121680 A1 * | 9/2002 | Ahn et al. | 257/666 |
| 2007/0096284 A1 * | 5/2007 | Wallace | 257/686 |
| 2007/0102762 A1 * | 5/2007 | Matsushima | 257/347 |
| 2008/0135991 A1 * | 6/2008 | Harnden et al. | 257/666 |

FOREIGN PATENT DOCUMENTS

| | | |
|---|---|---|
| CN | 1467828 | 1/2004 |
| CN | 1652332 | 8/2005 |
| JP | 2007-05569 | 1/2007 |

* cited by examiner

*Primary Examiner* — Kenneth A Parker
*Assistant Examiner* — David Spalla
(74) *Attorney, Agent, or Firm* — Fish & Richardson P.C.

(57) ABSTRACT

Provided is a semiconductor device in which a plurality of chips are packaged without increasing the thickness of the package. A plurality of semiconductor elements (a first and a second semiconductor elements) that are packaged in the semiconductor device are overlaid with each other. Specifically, the first semiconductor element is fixed on the top surface of the first island while the second semiconductor element is fixed on the bottom surface of the second island. Furthermore, each of the islands (a first and a second islands) on which the semiconductor elements are respectively mounted in the present invention provides a structure has an irregular shape, and the islands are overlaid with each other along the sides of the semiconductor element to be mounted.

9 Claims, 8 Drawing Sheets

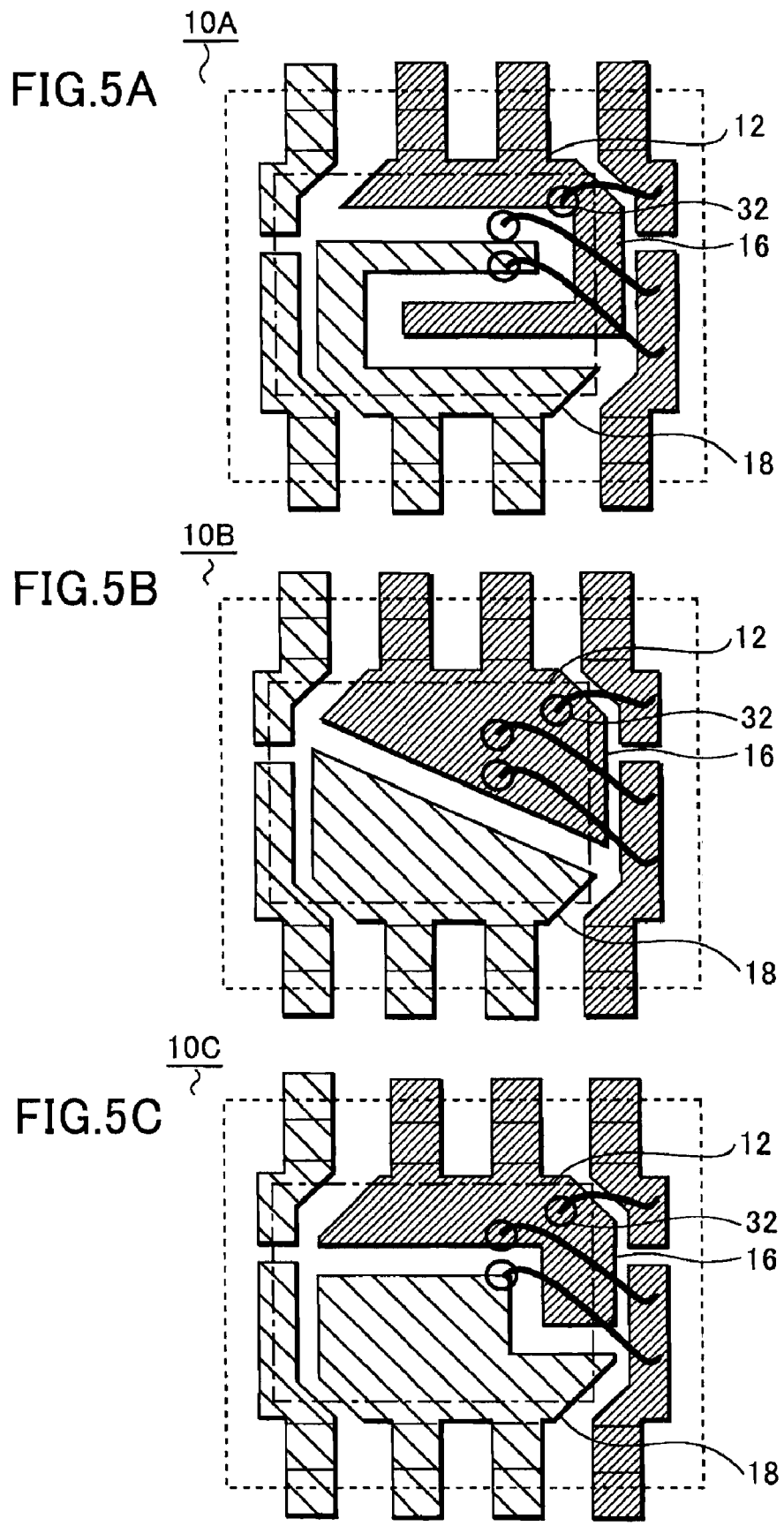

SEMICONDUCTOR DEVICE

This invention claims priority from Japanese Patent Application Number JP 2007-107636 filed on Apr. 16, 2007, the content of which is incorporated herein by reference in its entirety.

BACKGROUND OF THE INVENTION

1. Field of the Invention

The present invention relates to a semiconductor device. In particular, it relates to a semiconductor device on which a plurality of semiconductor elements are mounted as being stacked on one another in the thickness direction thereof.

2. Description of the Related Art

A semiconductor device with a lead frame, in general, includes an island and a plurality of leads each of which has a first end disposed near the island. To the top surface of the island, a semiconductor element is fixed, and thin metallic wires are provided to connect the leads with the bonding pads of the semiconductor elements (see, for example, Japanese Patent Application Publication No. 2007-5569). In addition, the island, the leads, the semiconductor element, and the thin metallic wires are encapsulated using an insulating resin while second end portions of the leads are left exposed. In each of the leads, the part encapsulated by the insulating resin is termed as an inner lead while the part exposed out of the insulating resin is termed as an outer lead. The outer lead is folded when necessary, and thus a second end of the lead is bonded to a printed circuit board or the like by a method, such as soldering.

Incidentally, a stack-type semiconductor device has been developed with a plurality of chips being stacked on an island. In this type of device, a child chip with a smaller size than a parent chip is stacked on the parent chip, and the parent and the child chips are electrically connected with each other with thin metallic wires.

Semiconductor devices with such a structure as described above benefit from the recent development of techniques for making anything lighter in weight, thinner in thickness, shorter in length, and smaller in dimension. In other words, miniaturization of such semiconductor devices is now made possible. Nevertheless, the semiconductor devices of the type still have their own problems. The top surface of the child chip is located at a higher position than the top surface of the parent chip on the island, that is, the top surface of the child chip is farther away from the surface of the island than the top surface of the parent chip is. When a thin metallic wire is connected with the top surface of the child chip, the highest portion of the thin metallic wire reaches an even higher position. As a result, the semiconductor device, precisely the package, is made thicker.

SUMMARY OF THE INVENTION

With the above-described problem taken into consideration, an object of the present invention is to provide a semiconductor device that can successfully mount a plurality of chips without increasing the thickness of the package.

An aspect of the present invention provides a semiconductor device of a type having a plurality of semiconductor elements which is disposed so as to stack on one another, and leads which are electrically connected with the semiconductor elements and parts of which are exposed out of the semiconductor device. The semiconductor device includes a first island which has a first main surface to be is a top surface and a second main surface to be a bottom surface, a first lead with an end that is disposed at a position close to the first island, and a first semiconductor element which is fixed on the first main surface of the first island, and which is electrically connected with the first lead. Moreover, the semiconductor device includes a second island. By contrast to the case of the first island, in the second island, a first main surface is a bottom surface and a second main surface is a top surface. Also included in the semiconductor devices are a second lead with an end that is disposed at a position close to the second island, and a second semiconductor element which is fixed on the first main surface of the second island, and which is electrically connected with the second lead. In the semiconductor device, a side surface of the first island and a side surface of the second island are overlaid, at least partially, with each other when viewed from a side of the first and the second semiconductor elements.

Another aspect of the present invention provides a semiconductor device of a type having a plurality of semiconductor elements which is disposed so as to stack on one another, and leads which are electrically connected with the semiconductor elements and parts of which are exposed out of the semiconductor device. The semiconductor device includes a first island which has a first main surface to be is a top surface and a second main surface to be a bottom surface, a first lead with an end that is disposed at a position close to the first island, and a first semiconductor element which is fixed on the first main surface of the first island, and which is electrically connected with the first lead. Moreover, the semiconductor device includes a second island. By contrast to the case of the first island, in the second island, a first main surface is a bottom surface and a second main surface is a top surface. Also included in the semiconductor devices are a second lead with an end that is disposed at a position close to the second island, and a second semiconductor element which is fixed on the first main surface of the second island, and which is electrically connected with the second lead. Moreover, the semiconductor device also includes a third lead which is connected with an electrode of the first semiconductor element, and which has a bonding portion on the same plane where the first island exists. Furthermore, the semiconductor device includes a fourth lead which is connected with an electrode of the second semiconductor element, and which has a bonding portion on the same plane where the second island exists. In the semiconductor device, a side surface of the first island and a side surface of the second island are overlaid, at least partially, with each other when viewed from a side surface of the semiconductor device.

BRIEF DESCRIPTION OF THE DRAWINGS

FIGS. 5A to 5C are plan views showing semiconductor devices with different structures of other embodiments of the present invention.

DETAILED DESCRIPTION OF THE PREFERRED EMBODIMENTS

A semiconductor device 10 according to a first embodiment of the present invention is to be described hereinbelow with reference to FIG. 1 to FIG. 5. FIG. 1 and FIG. 2 show the semiconductor device 10. FIG. 3 and FIG. 4 show, though partially, a lead frame that forms a part of the semiconductor device. FIG. 5 shows the structures of semiconductor devices according to other embodiments.

Figure 1A:
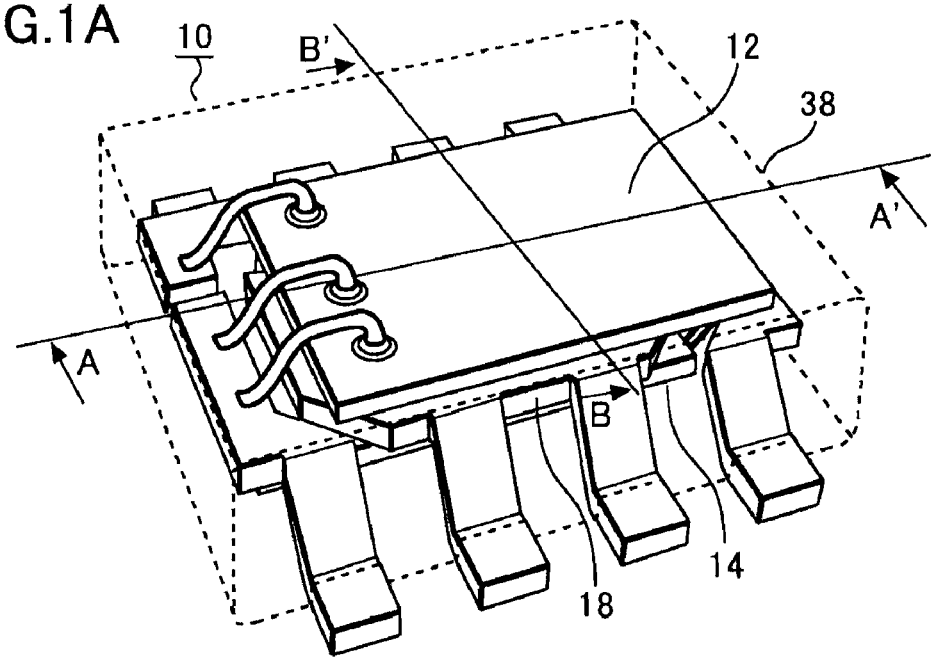
FIG. 1A is a perspective view.
Figure 1B:
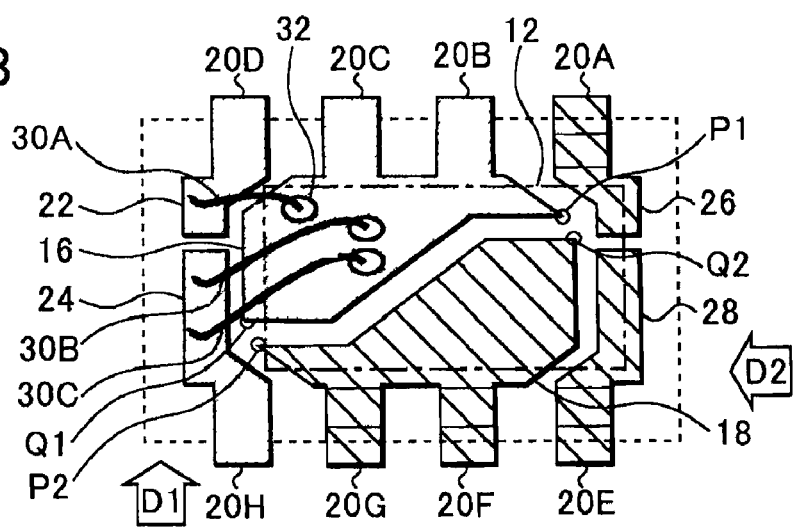
FIG. 1B is a plan view and FIG. 1C is another plan view, all of which show a semiconductor device of an embodiment of the present invention.
Figure 1C:
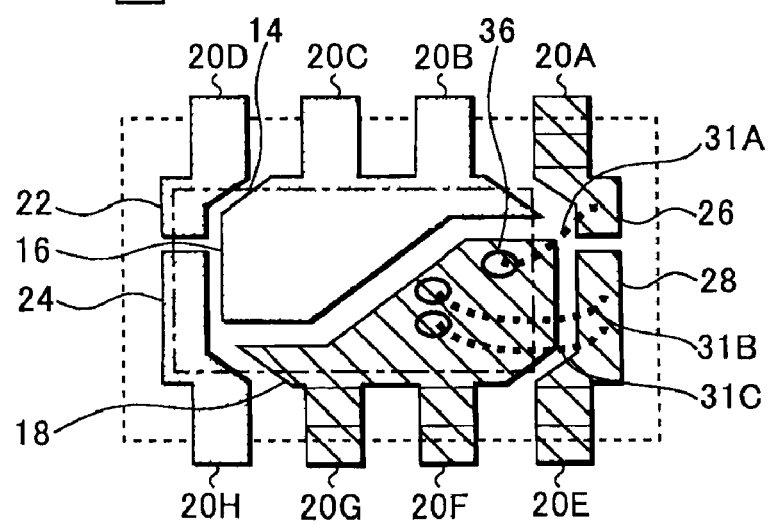

The structure of the semiconductor device 10 is to be described with reference to FIG. 1. FIG. 1A is a perspective view illustrating the semiconductor device 10. FIG. 1B is a top plan view of the semiconductor device 10, and FIG. 1C is a bottom plan view of the semiconductor device 10.

FIG. 1A shows the semiconductor device 10, which is a resin-encapsulated semiconductor package in which a plurality of semiconductor elements are encapsulated with a resin. The semiconductor device 10 has an appearance that approximates a cube or a rectangular solid. The top and the bottom surfaces, both of which are flat surfaces, are parallel to each other. The side surfaces are inclined with the upper portion of each side surface being located at an inner place than the lower portion thereof. The entire body of the semiconductor device 10 is encapsulated with an encapsulating resin 38 to form a unit. End portions of leads that are electrically connected with the mounted semiconductor devices stick out from the bottom portions of the side surfaces of the encapsulating resin 38. The bottom surface of each lead thus exposed to the outside is located on the same plane that the bottom surface of the encapsulating resin 38 is located. The encapsulation of the semiconductor device 10 is done by a reflow process. In the process, a cream solder (not illustrated) that has been applied to the exposed lead is heated to be melted.

Inside the semiconductor device 10, a plurality of semiconductor elements (in this case, a first semiconductor element 12 and a second semiconductor element 14) are mounted as one being overlaid with another. Now, refer to each of the drawings in FIG. 1. The first semiconductor element 12 is fixed on the top surface (a first main surface) of a first island 16, and the second semiconductor element 14 is fixed on the bottom surface (a first main surface) of a second island 18. Accordingly, the first and the second semiconductor elements 12 and 14 are placed in directions that are opposite to each other in the thickness direction of the semiconductor device 10. To put it other way, in the first semiconductor element 12, electrodes are formed on the surface that faces upwards. By contrast, in the second semiconductor element 14, electrodes are formed on the surface that faces downwards.

The structure in a plane of the semiconductor device 10 is to be described with reference to FIG. 1B and FIG. 1C. In these drawings, what is indicated by the dotted line is the perimeter of the encapsulating resin 38 while the dasheddotted line indicates the perimeter of the first semiconductor device. The densely hatched area in these drawings represents a first lead frame—the leads and the lands that are associated with the mounting and the connecting of the first semiconductor element 12. Meanwhile, the lightly hatched area represents a second lead frame—the leads and the lands that are associated with the mounting and the connecting of the second semiconductor element 14. The first lead frame has a bonding portion 24 located on a plane that is different from the plane where the first island 16 is located. The second lead frame has a bonding portion 28 located on a plane that is different from the plane where the second island 18 is located. As FIG. 1B shows, the bonding portion 24 of the first lead frame and the first island 16 are located at higher positions than the positions where the bonding portion 28 of the second lead frame and the second island 18 are located.

Some of the functions of the encapsulating resin 38 are the coating of the semiconductor elements and the lead frames, as well as the supporting of the semiconductor elements and the lead frames as a unit. Some examples of the resin material for the encapsulating resin 38 are a thermosetting resin (for example, an epoxy resin) that can be formed by transfer molding and a thermoplastic resin (for example, an acrylic resin) that can be formed by injection molding. Alternatively, a resin material filled with a filler material, such as a metal oxide, can be used for the encapsulating resin 38 for the purpose of lowering the thermal resistance of the encapsulating resin 38 and the like. Here, the encapsulating resin 38 coats the leads, the islands, the semiconductor elements, and the thin metallic wires to form a unit. In addition, end portions of the leads are exposed outside the encapsulating resin 38, and the exposed portions function as terminals for the external connection.

FIG. 1B is a top plan view of the semiconductor device 10 shown in FIG. 1A and shows that the first semiconductor element 12 fixed on the top surface of the first island 16 is connected to the top surface of a lead 20D and the like with a thin metallic wire 30A and the like. In this embodiment, three thin metal wires 30 are used to electrically connect the leads and the first semiconductor element 12. Specifically, the thin metallic wire 30A connects an electrode 32 of the first semiconductor element 12 with the top surface of a bonding portion 22 of the lead 20D. In addition, two thin metallic wires 30B and 30C are used to connect two other electrodes 32 with the top surface of the bonding portion 24 of a lead 20H. For example, when the first semiconductor element 12 is an MOSFET, the thin metallic wire 30A is used to connect a gate electrode (control electrode: one of the electrodes 32 in this case) with the bonding portion 22 of the lead 20D. In addition, the two other thin metallic wires 30B and 30C are used to connect the other two electrodes 32 that are source electrodes (main electrodes) with the bonding portion 24 of the lead 20H. Though a relatively large current flows through the main electrodes, the use of more thin metallic wires for the connection than in the case of the gate electrode, which is the control electrode, lowers the electrical resistance of the thin metallic wires. This results in a lower ON-resistance. Incidentally, the back surface of the serves, for example, as a drain electrode (main electrode), and is electrically connected with the top surface of the first island 16. Here, the average area of the first island 16 is smaller than the area of the first semiconductor element 12.

FIG. 1C is a bottom plan view of the semiconductor device 10 shown in FIG. 1A and shows that the second semiconductor element 14 is mounted on the bottom surface of the second island 18. As in the case of the first semiconductor element 12 described above, electrodes 36 formed on the bottom surface of the second semiconductor element 14, which is, for example, an MOSFET, are connected with the bonding portions of the leads by use of thin metallic wires. To be more specific, a thin metal wire 31A are used to connect one of the electrodes 36 formed on the bottom surface of the second semiconductor element (in this embodiment, the one serves as a gate electrode) with a bonding portion 26 of a lead 20A.

In addition, two thin metallic wires 31B and 31C are used to connect the other two electrodes 36 (source electrodes) of the second semiconductor element 14 with the bottom surface of the bonding portion 28 of a lead 20E. Incidentally, a drain electrode formed on the top surface of the second semiconductor element 14 is connected with the bottom surface of the second island 18. Here, the average area of the second island 18 is smaller than the area of the second semiconductor element 14.

In each of the two semiconductor elements with the above-described structure, one of the semiconductor elements is disposed so as to be laid even over the island on which the other one of the semiconductor elements is mounted. Specifically, as FIG. 1B shows, the first semiconductor element 12 fixed on the top surface of the first island 16 is disposed so as to be laid even over the second island 18. In addition, as FIG. 1C shows, the second semiconductor element 14 mounted on thy bottom surface of the second island 18 is disposed so as to be laid even under the bottom surface of the first island 16. Accordingly, a plurality of semiconductor elements can be disposed, within a limited planar area, so as to be stacked. Note that both of the semiconductor elements do not have to cover the areas of the two islands. It is allowed that only one of the semiconductor elements cover the areas of the two islands. Note also that, in this embodiment, each of the two semiconductor elements is disposed so as to be laid even over, or under, the bonding portions of for the other one of the semiconductor elements.

FIG. 1B and FIG. 1C show that the first and the second islands 16 and 18 are disposed so as to be overlaid each other in a direction parallel to a side of the semiconductor elements 12 and 14 that are mounted on the respective islands 16 and 18. In this embodiment, each of the first and the second semiconductor elements 12 and 14 has a rectangular planer shape with its long sides extending along the right and left direction of the drawings. The direction in which the first and the second islands 16 and 18 are overlaid each other is this longitudinal direction of the semiconductor elements 12 and 14.

Incidentally, in an ordinary semiconductor element, an island on which a semiconductor element is mounted has a rectangular shape with a size that is a little larger than the size of the mounted semiconductor element. The semiconductor device in this embodiment, however, is just a compact-sized, chip-scale package (CSP) with an outside dimension that is only slightly larger than the packaged semiconductor element. This means that an island with a larger area than the area of the semiconductor element to be mounted thereon leads to an increase in size. A smaller island than the semiconductor element to be mounted thereon can contribute to the miniaturization of the semiconductor device, but may possibly lead to an unsteady mounting of the semiconductor element.

That is why, in this embodiment, each of the islands on which the semiconductor elements are mounted respectively does not have a rectangular shape, but has an irregular shape. For example, as FIG. 1B shows, the shape of the first island 16 approximates a triangle. To be more precise, the first island 16 is a right triangle with its square corner located in the upper left portion of the drawing, and has a shorter side in the right-and-left direction in the drawing than the side in the up-and-down direction. In addition, compared with the shape of an ordinary right triangle, the first island 16 has a sticking-out portion on the right-hand side end portion thereof. Moreover, the area of the first island 16 is smaller than the area of the first semiconductor element 12 to be mounted thereon. This structure helps the first island 16 with a smaller area provide a steadier support for the first semiconductor element 12.

The second island 18, on the other hand, has an identical shape to the shape of the first island 16, but the two islands 18 and 16 are placed symmetrically with respect to a point. In other words, a 180° rotation of the first island 16 about a certain point in the drawing gives the shape and the placement of the second island 18. Naturally, the area of the second island 18 is equal to the area of the first island 16.

Furthermore, the first and the second islands 16 and 18 in this embodiment overlap each other in a direction that is parallel to the longer sides of the first semiconductor element 12. To put it other way, in a perspective view of the semiconductor device 10 seen from as indicated by the arrow D1 in FIG. 1B, the first and the second islands 16 and 18 overlap each other almost entirely, except for the two end portions. This structure helps each of the islands 16 and 18 provide an even steadier support for the corresponding one of the semiconductor elements 12 and 14 mounted on the respective islands 16 and 18. Certainly, for example, it is somehow possible to mount semiconductor elements on respective rectangular-shaped islands placed as being separated from each other in the right-and-left direction of the drawing. Nevertheless, when rectangular-shaped semiconductor elements are mounted as sticking out of the land, this kind of arrangement has a difficulty in providing a steady support for the semiconductor elements to be mounted.

To counter such difficulty, as has been described thus far, the first and the second islands 16 and 18 in this embodiment are disposed so as to overlap each other along the direction parallel to the side of the semiconductor elements 12 and 14. Specifically, as FIG. 1B shows, the first island 16, most of which is located on the left-hand side of the drawing, has a right-hand end portion P1 positioned on the right-hand side of a left-hand end portion P2 of the second island 18, most of which is located on the right-hand side of the drawing. In addition, the right-hand end portion P1 of the first island is positioned at, or near, the right-hand end of the second island 18. Moreover, the left-hand end portion P2 of the second island 18 is positioned under, or near, the left-hand side of the first island 16. This structure contributes to a steady mounting of the first semiconductor element 12 on the top surface of the first island 16, and to a steady mounting of the second semiconductor element 14 on the bottom surface of the second island 18.

In this embodiment, the two islands 16 and 18 are disposed so as to overlap each other also in the direction of the shorter side of the semiconductor elements 12 and 14 (in the up-and-down direction in the drawing). To put it other way, in a perspective view of the semiconductor device 10 seen from as indicated by the arrow D2 in FIG. 1B, the first and the second islands 16 and 18 overlap each other. To be more specific, a bottom end Q1 of the first island 16, which is positioned over the second island 18 in the drawing, is located at a position lower than a top end Q2 of the second island 18, which is positioned under the first island 16.

As has been described above, the first and the second islands 16 and 18 are formed into shapes such that the two islands 16 and 18 overlap each other both in the longer-side and in the shorter side directions of the packaged semiconductor elements. As a result, the semiconductor elements can be fixed more steadily.

Furthermore, in this embodiment, the electrodes formed on the main surface of each of the semiconductor elements are disposed within the region of the corresponding island on which that one of the semiconductor elements is mounted.

Specifically, FIG. 1B shows that the three electrodes 32 formed on the top surface of the first semiconductor element 12 are positioned within the area that is laid over the first island 16. This structure protects the first semiconductor element 12 against the impact that may possibly be caused by the wire bonding and the like. Specifically, the first island 16 absorbs the bonding energy (thermal energy, pressing force, or ultrasonic oscillation) added to the electrode 32 in the wire bonding process for connecting the thin metal wire 30A with the electrode 32. Accordingly, even the bonding energy does not cause the destruction of the first semiconductor element 12. The second semiconductor element 14 also has such technological features as described above. The electrodes 36 formed on the bottom surface of the second semiconductor element 14 are positioned within the area that is laid under the second island 18.

Figure 2A:
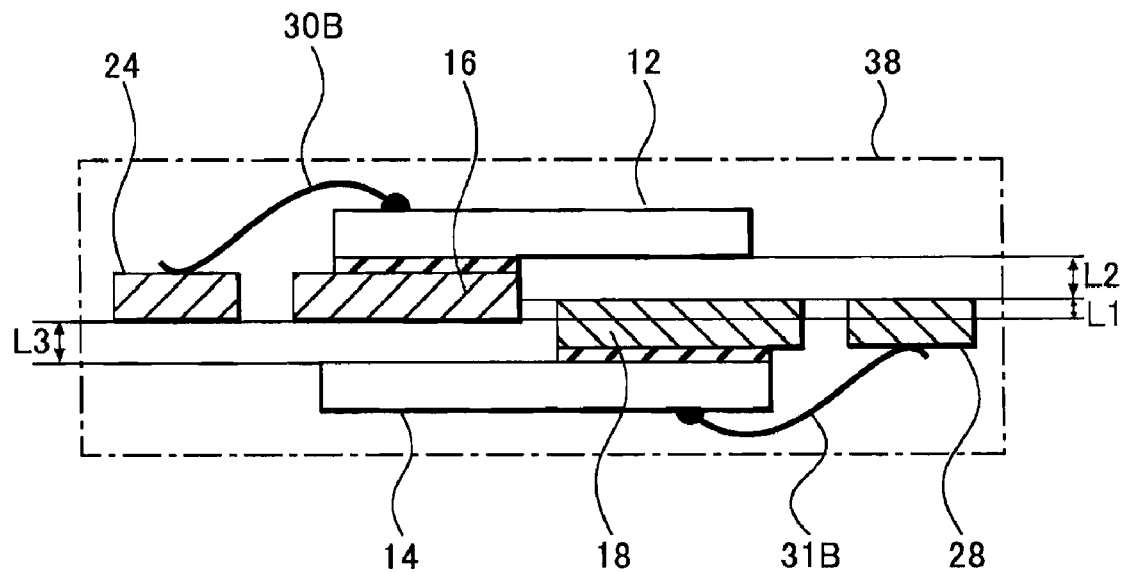
FIGS. 2A and 2B are cross-sectional views showing the semiconductor device of the embodiment of the present invention.
Figure 2B:
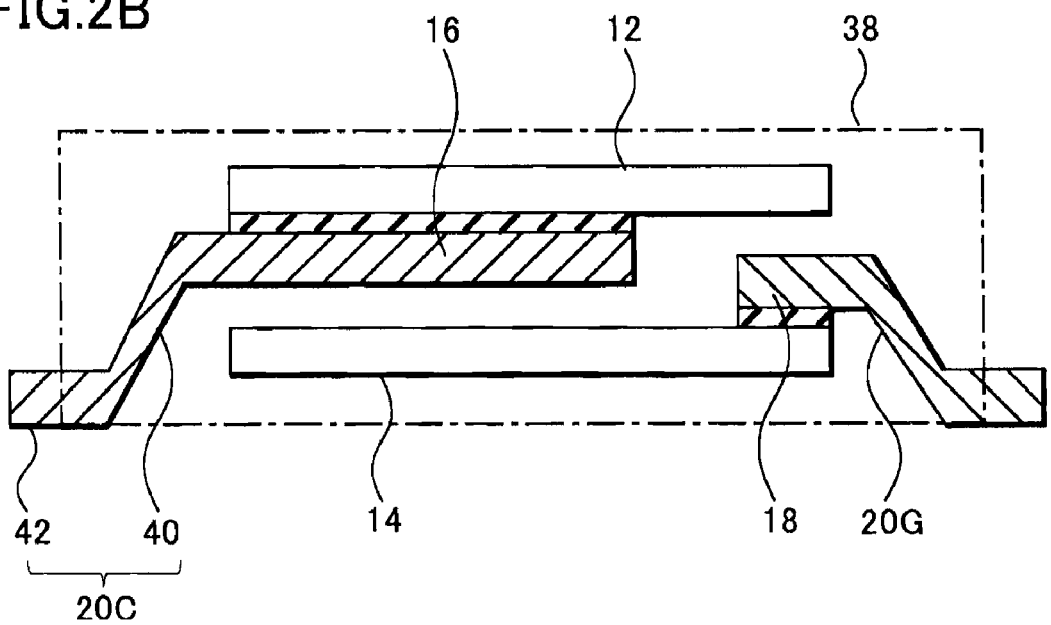

Subsequently, the cross-sectional structure of the semiconductor device 10 will be described with reference to FIG. 2. FIG. 2A shows a cross section taken along the line A-A' in FIG. 1A. FIG. 2B shows a cross section taken along the line B-B' in FIG. 1A.

As FIG. 2A shows, the first semiconductor element 12 is fixed on the top surface of the first island 16, and the thin metal wire 30B is used to connect the electrode on the top surface of the first semiconductor element 12 with the bonding portion 24 of the lead. The second semiconductor element 14, on the other hand, is fixed on the bottom surface of the second island 18, and the thin metal wire 31B is used to connect the electrode of the second semiconductor element 14 with the bottom surface of the bonding portion 28 of the lead.

In this embodiment, the first and the second islands 16 and 18 are disposed not only so as to be shifted from each other in the thickness direction of the semiconductor device 10, but also so as to be partially overlaid with each other in the thickness direction. In this embodiment, the first island 16 is shifted slightly upwards within the encapsulating resin 38 while the second island 18 is shifted down to a position that is lower than the position of the first island 16. Note that the two islands 16 and 18 may be partially overlaid with each other, but that the two islands 16 and 18 may also be arranged so as not to be overlaid with each other at all.

An example of the thickness of the first and the second islands 16 and 18 is approximately 0.5 mm. In addition, an example of the thickness of the overlaid portion of the two islands (such a thickness is represented by L1) is approximately 0.2 mm. The separation distance between the bottom surface of the first island 16 and the top surface of the second semiconductor element 14 (such a distance is represented by L2) is approximately 0.3 mm. The separation distance between the bottom surface of the first semiconductor element 12 and the top surface of the second island 18 (such a distance is represented by L3) is approximately 0.3 mm.

The partial overlaying of the first and the second island 16 and 18 in the thickness direction of the semiconductor device 10 makes the semiconductor device 10 thinner and helps the insulation between the islands 16 and 18 and the semiconductor elements 12 and 14 be maintained. For example, the thickness of the semiconductor device 10 is made thinner by the amount that is equivalent to the overlaid thickness of the islands 16 and 18 in the thickness direction (by the thickness L1) than the corresponding thickness in the case of two semiconductor elements mounted, respectively, on the top and the bottom main surfaces of a single island.

In addition, the first semiconductor element 12 is disposed on the top surface of the first island 16 while the back surface and the side surfaces of the first island 16 are covered with the encapsulating resin 38 that encapsulates the entire first island 16. The second semiconductor element 14 is fixed on the bottom surface of the second island 18 while the top surface and the side surfaces of the second island 18 are covered with the encapsulating resin 38. The arrangement of the first and the second islands 16 and 18 that are shifted from each other makes the first island 16 be separated from the second semiconductor element 14 and also makes the second island 18 be separated from the first semiconductor element 12. Accordingly, even the packaging of stacked larger semiconductor elements in the relatively compact semiconductor device 10 causes no short circuit between the semiconductor elements and islands.

Moreover, in this embodiment, the encapsulating resin 38 is filled in the gap between the bottom surface of the first island 16 and the top surface of the second semiconductor element 14, as well as in the gap between the top surface of the second island 18 and the bottom surface of the first semiconductor element 12. In this respect, when the filling of the encapsulating resin 38 that contains a filler is difficult to be carried out, a fluid resin material (for example, a resin with a relatively small content of filler) may be filled in these gaps before the process of resin encapsulation. Alternatively, an adhesive agent of, for example, an epoxy resin, may be filled in the gaps.

Furthermore, as long as the electric current passes through the back surface of each of the semiconductor elements 12 and 14, the semiconductor elements 12 and 14 are fixed, by a electrically conductive adhesive agent or by eutectic bonding, respectively on the main surfaces of the corresponding islands on which the semiconductor elements 12 and 14 are mounted respectively. Alternatively, when the back surface of each of the semiconductor elements 12 and 14 needs no electrical conductivity, the semiconductor elements 12 and 14 may be mounted on the respective islands 16 and 18 by an insulating adhesive agent.

FIG. 2B shows the structure of a lead 20C. The lead 20C is composed of an inclined portion 40 and an exposed portion 42. The inclined portion 40 is formed contiguously to the first island 16 and extends outwards as being inclined downwards. The exposed portion 42 is exposed out of the encapsulating resin 38, and has a bottom surface that is positioned on the same plane where the bottom surface of the encapsulating resin 38 is positioned. Each of the other leads has the same structure.

FIG. 3 and FIG. 4 are perspective views of the semiconductor device 10 shown in FIG. 1, but each drawing illustrates only a part of the semiconductor device 10 that is extracted as needed.

Figure 3A:
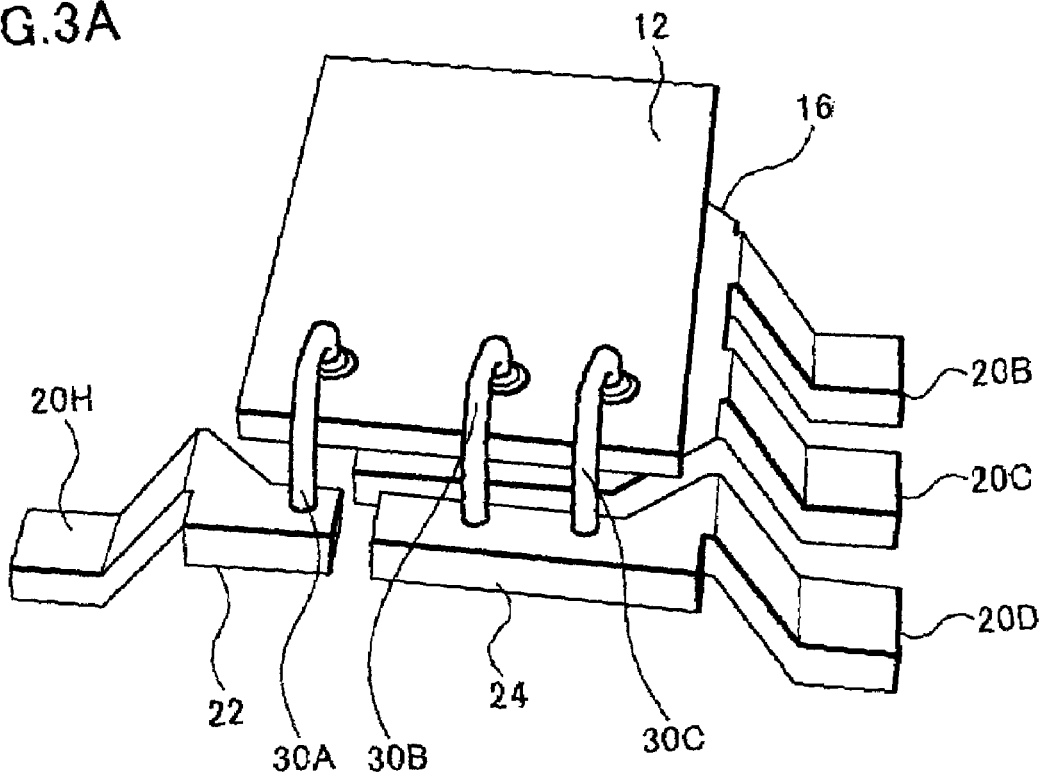
FIGS. 3A and 3B are partial perspective views of the semiconductor device of the present invention.
Figure 3B:
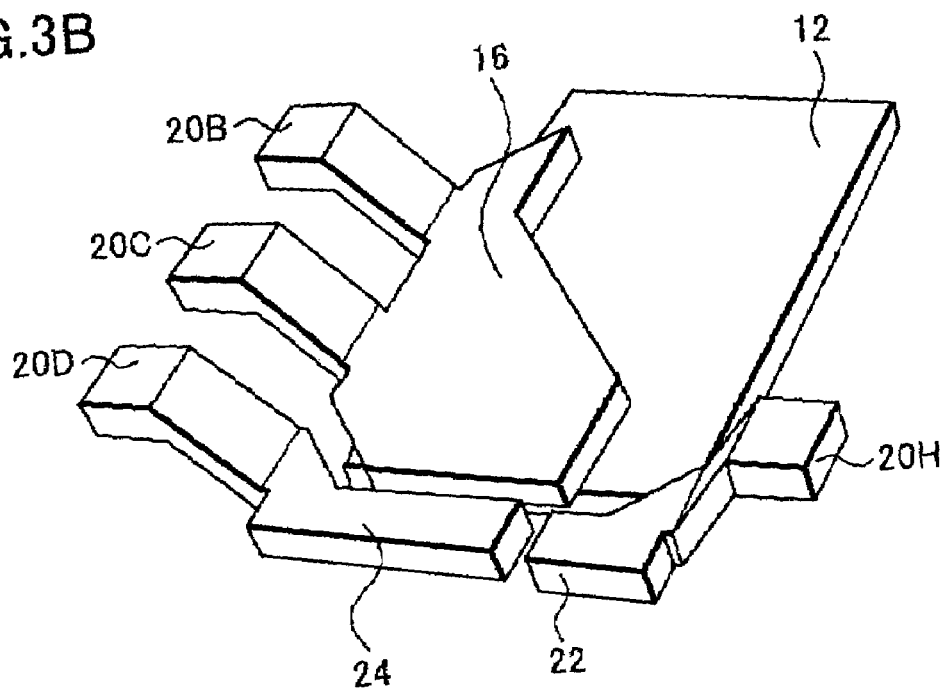

Now, descriptions will be given, with reference to FIG. 3, as to the structure including, among other things, the first island 16, on which the first semiconductor element 12 is mounted, or to which the first semiconductor element 12 is connected. FIG. 3A is a perspective view from above of the first semiconductor element 12, the first island 16 and the like constructed into a structure shown in FIG. 1A. FIG. 3B is a perspective view illustrating the same structure, but in this case the structure is viewed from below.

FIGS. 3A and 3B illustrate the first island 16 on which the first semiconductor element 12 is mounted, and two leads that are lead out of the first island 16—specifically, a lead 20B and the lead 20C. In addition, the leads 20H and 20D are illustrated on the near side of the drawing. The thin metallic wire 30A is used to connect the bonding portion 22 of the lead 20H with the first semiconductor element 12 while the thin metallic wires 30B and 30C are used to connect the bonding portion 24 of the lead 20D with the first semiconductor element 12.

In the manufacturing process, the first island 16, and the leads 20H and 20D that are lead out from the first island 16, all of which are shown in these drawings, are supplied in a state of a single lead frame. In other words, the first island 16, and the leads 20H and 20D are manufactured in a single body that has not yet been separated.

Now, descriptions will be given, with reference to FIG. 4, as to the structure including, among other things, a lead 20G and the second island 16, on which the second semiconductor element 14 is mounted. FIG. 4A and FIG. 4B, as in the case of FIGS. 3A and 3B, are views from above and from below, respectively.

Figure 4A:
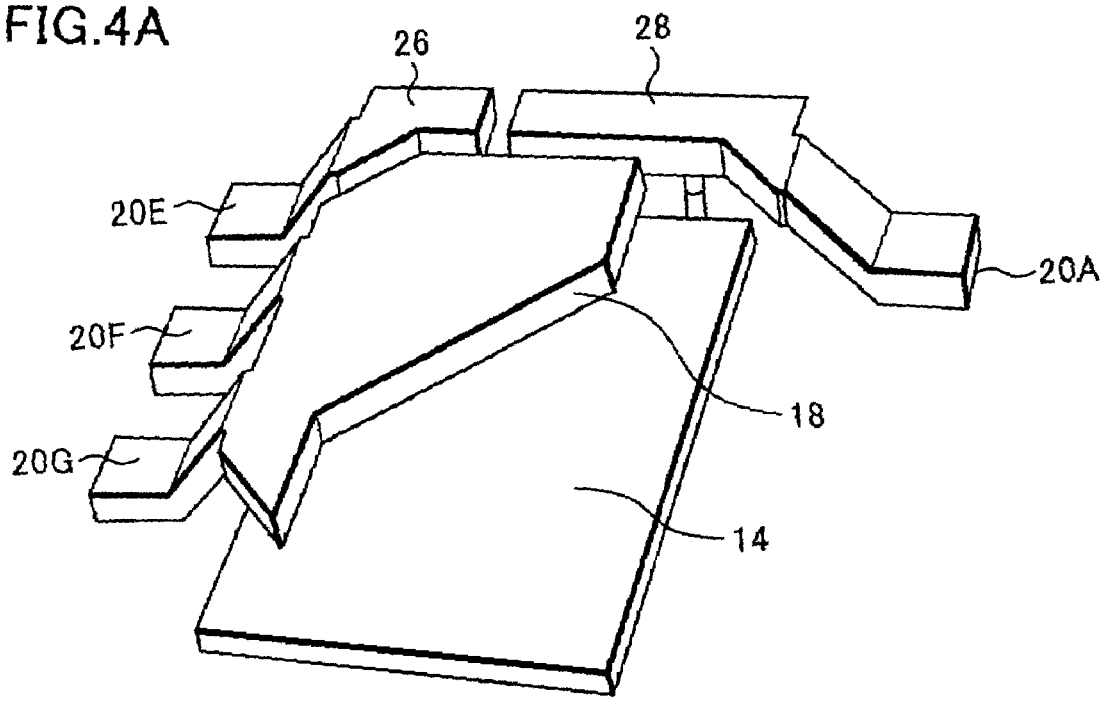
FIGS. 4A and 4B are partial perspective views of the semiconductor device of the present invention.
Figure 4B:
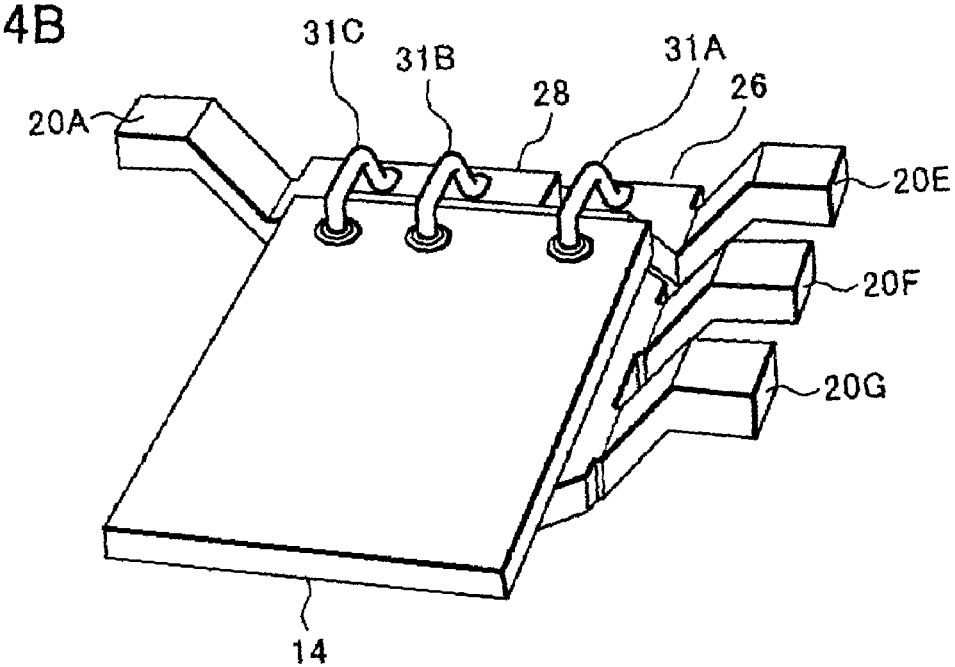

FIG. 4A and FIG. 4B illustrate the lead 20G and a lead 20F are lead out of the second island 18 on which the second semiconductor element 14 is mounted. In addition, the thin metallic wire 31A is used to connect the bottom surface of the bonding portion 26 of the lead 20E with the electrode formed on the bottom surface of the second semiconductor element 14. The thin metallic wires 30C and 30B are used to connect the bonding portion 28 of the lead 20A with the electrodes of the second semiconductor elements 14.

In the manufacturing process, the second island 18, as well as the leads 20E and 20A, all of which are shown in these drawings, are supplied in a state of a single lead frame. In other words, the second island 18, and the leads 20E and 20A are manufactured in a single body that has not yet been separated. In this embodiment, the lead frame including the second island 18 and the like shown in FIG. 4 is formed into a different body from the lead frame including the first island 16 shown in FIG. 3.

The structures of semiconductor devices of other embodiments will be described with reference to FIG. 5. Each of the drawings of FIG. 5 is a top plan view of one of the semiconductor devices of other embodiments. The structure of each of the semiconductor devices shown in these drawings is basically the same as the structure of the semiconductor device 10 described above. The difference, however, lies in the planar shapes of the first and the second islands 16 and 18.

FIG. 5A shows that a semiconductor device 10A has a first and a second islands 16 and 18 each with a shape that resembles a comb. To put it other way, each of the islands 16 and 18 has a square C-shape, and the two square Cs are engaged with each other. Such a structure of the two islands 16 and 18 can increase the area used to support the semiconductor elements 12 and 14, which are mounted on the respective islands 16 and 18. As a result, the semiconductor 12 and 14 devices can be mounted on the respective islands 16 and 18.

FIG. 5B shows that a semiconductor device 10B has a first and a second islands 16 and 18 each with a shape that approximates a triangle more closely than the first and the second islands 16 and 18 in the case of the semiconductor device 10 described above. Also this shape provides a steady supporting provided by the islands 16 and 18 for the semiconductor elements 12 and 14 to be mounted on the respective islands 16 and 18.

FIG. 5C shows that a semiconductor device 10C has a first and the second islands 16 and 18 each with a crank shape. The bent portion of the crank-shaped first islands 16 is located under one of electrodes 32 formed on the top surface of the first semiconductor element 12.

FIGS. 5A to 5C present another possible understanding of the structure of the semiconductor device of the present invention. In planar terms, there is a slit that separates the first island 16 from the second island 18.

Next, a method of manufacturing the semiconductor device 10 with a structure such as the one that has been described thus far will be described with reference to FIG. 6 to FIG. 8. In this embodiment, a die-bonding work and a wire-bonding work are carried out on each of two lead frames (a lead frame 50 shown in FIG. 6 and a lead frame 80 shown in FIG. 7). After the resultant two lead frames are stacked and then are encapsulated with a resin. Thus, the semiconductor devices are manufactured.

Figure 6A:
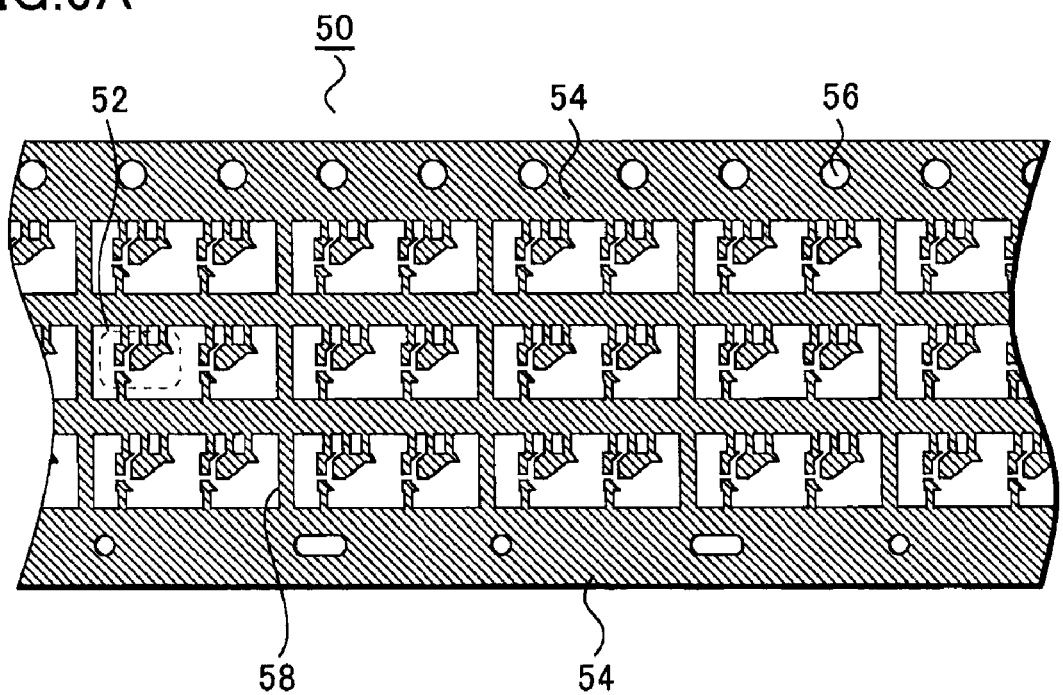
FIG. 6A is a plan view and FIG. 6B is a perspective view showing a method of manufacturing the semiconductor devices of an embodiment of the present invention.
Figure 6B:
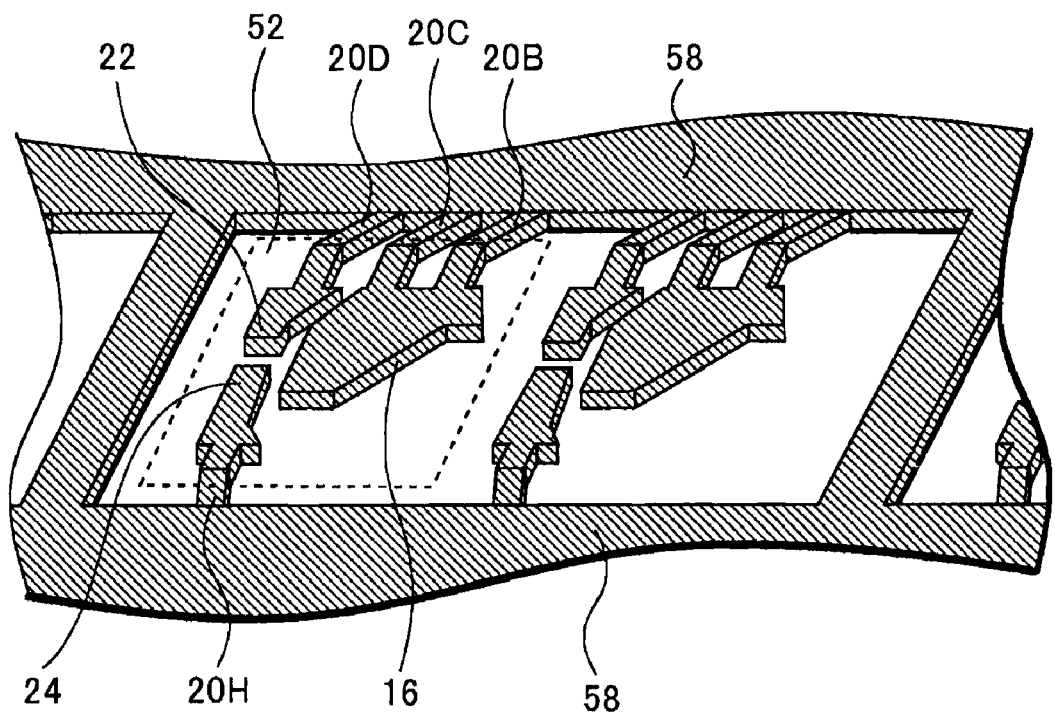

FIG. 6 shows a structure of the lead frame 50. FIG. 6A is a partial plan view of the lead frame 50. FIG. 6B is an enlarged perspective view of a unit 52.

FIG. 6A shows the lead frame 50. The lead frame 50 is made of a metal such as copper. A single conductive foil with an approximate thickness of 0.5 mm is processed (by etching or by punching) to be formed into a predetermined shape. In this embodiment, the lead frame 50 has a substantial reed shape. Frame-shaped outer frames 54 are formed as the four sides of the lead frame 50, and joint portions 58 extend within the area surrounded by the outer frames 54 so as to form a lattice-like shape.

Guide holes 56 are formed in the outer frames 54 as penetrating the outer frames 54 in the thickness direction. The guide holes are used for the purpose of the transportation and the positioning of the lead frame 50 in each process. By overlaying the guide holes 56 formed in the lead frame 50 shown in FIG. 6A with guide holes 66 of the lead frame 60 shown in FIG. 7A, an accurate positioning of the units included in each lead frame can be accomplished.

FIG. 6B shows one of the units 52 formed in an area surrounded by the joint portions. The unit 52 is the unit of component element constituting a single semiconductor device. A single one of the units 52 in this embodiment corresponds to the region that is densely hatched in FIG. 1B. Specifically, three leads (the leads 20D, 20C and 20B) extend inwards from the joint portion 58 located on the far side of the drawing. The leads 20C and 20B are contiguous to the first island 16. The bonding portion 22 is formed on the head end portion of the lead 20D. In addition, a single one of the leads, specifically, lead 20H, extends inwards from the joint portion 58 located near side of the drawing. The bonding portion 24 is formed on the head end portion of the lead 20H. Moreover, each of the leads is composed of the inclined portion 40 and the exposed portion 42, which are shown in FIG. 2B. Note that the head end portions of the leads extending inwards of the unit 52 and the first island 16 are positioned at a single plane that is higher than other portions (the outer frames 54 and the joint portions 58) of the lead frame 50.

In this embodiment, as has been described above, a semiconductor device is formed by overlaying the lead frame 50 with the lead frame 60. In the semiconductor device 10 thus manufactured (see FIG. 1), the bottom surfaces of the leads are positioned on a single plane. Accordingly, a stamping process to make the lead protrude out upwards (in the thickness direction) may be carried out at portions where the joint portions 58 and the leads of the lead frame 50 are joined with each other. As a result, the end portions of the leads included in the lead frame 50 and the end portions of the leads included in the lead frame 60 are positioned on a single plane. The lead frame 60 may have the same features, and a detail description of the structure of the lead frame 60 will be given below.

Figure 7A:
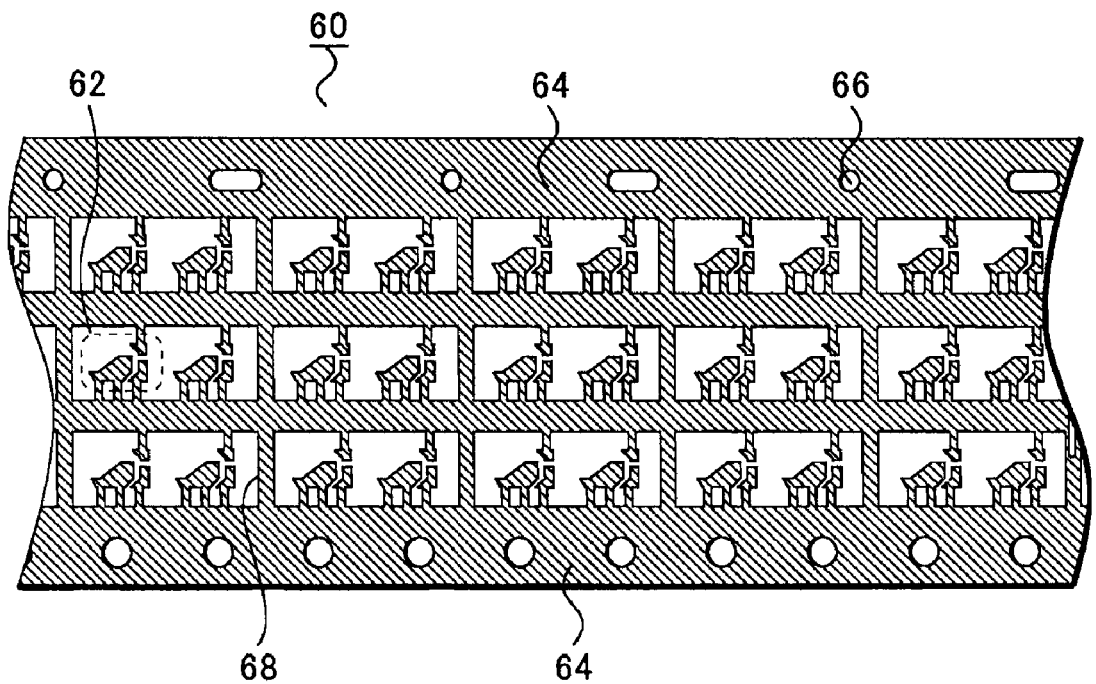
FIG. 7A is a plan view and FIG. 7B is a perspective view showing a method of manufacturing the semiconductor devices of an embodiment of the present invention.
Figure 7B:
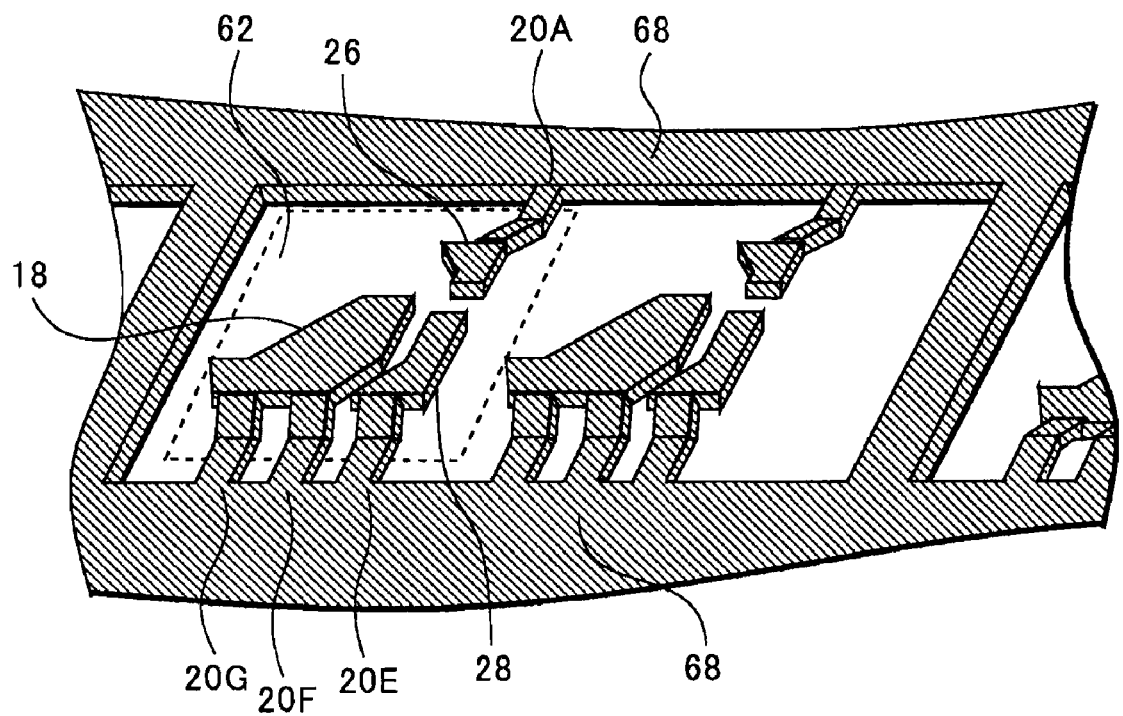

FIG. 7 illustrates the structure of the lead frame 60. FIG. 7A is a plan view of the lead frame 60, and the FIG. 7B is a perspective view showing a unit 62. Note that the lead frame 60 corresponds to the lightly hatched portion in FIG. 1B. Also note that the lead frame 60 shown in FIG. 7 has a similar internal structure to the lead frame 50 shown in FIG. 6. The only difference between the lead frames 50 and 60 lies in the internal structure of the unit 62, and the other structures between the lead frames 50 and 60 are basically the same.

FIG. 7A shows that, in the lead frame 60, joint portions 68 are formed from an outer frame 64 so as to form a lattice shape. Two of the units 62 are disposed in an opening surrounded by the joint portions 68. In this case also, guide holes 66 are formed in the outer frame 64 as penetrating the outer frame 64 in the thickness direction.

FIG. 7B shows that one of the leads 20A extends inwards from the joint portion 68 located on the far side of the drawing. The head end portion of the lead 20A is formed into a flat shape and is made to be the bonding portion 26. In addition, three leads 20G, 20F and 20E extend inwards from the joint portion 68 located on the near side. The head end portions of the two leads 20G and 20F are contiguous to the second island 18. Moreover, the head end portion of the lead 20E is made to be the bonding portion 28.

FIG. 6B and FIG. 7B show that the differences between the unit 52 and the unit 62 are in the shapes of islands and in which of the thickness directions in which the leads protrude. The first and the second islands 16 and 18 have identical shapes but are placed symmetrically with respect to a point. In other words, a 180° rotation of the first island 16 about a certain point in the drawing gives the shape and the placement of the second island 18. The protruding direction of the leads in the unit 52 shown in FIG. 6B is the same direction that the surface on which the semiconductor element is mounted faces (upwards in the drawing). The protruding direction of the leads in the unit 62 shown in FIG. 7B is the direction opposite to the direction that the surface on which the semiconductor element is mounted faces (upwards in the drawing).

Figure 8A:
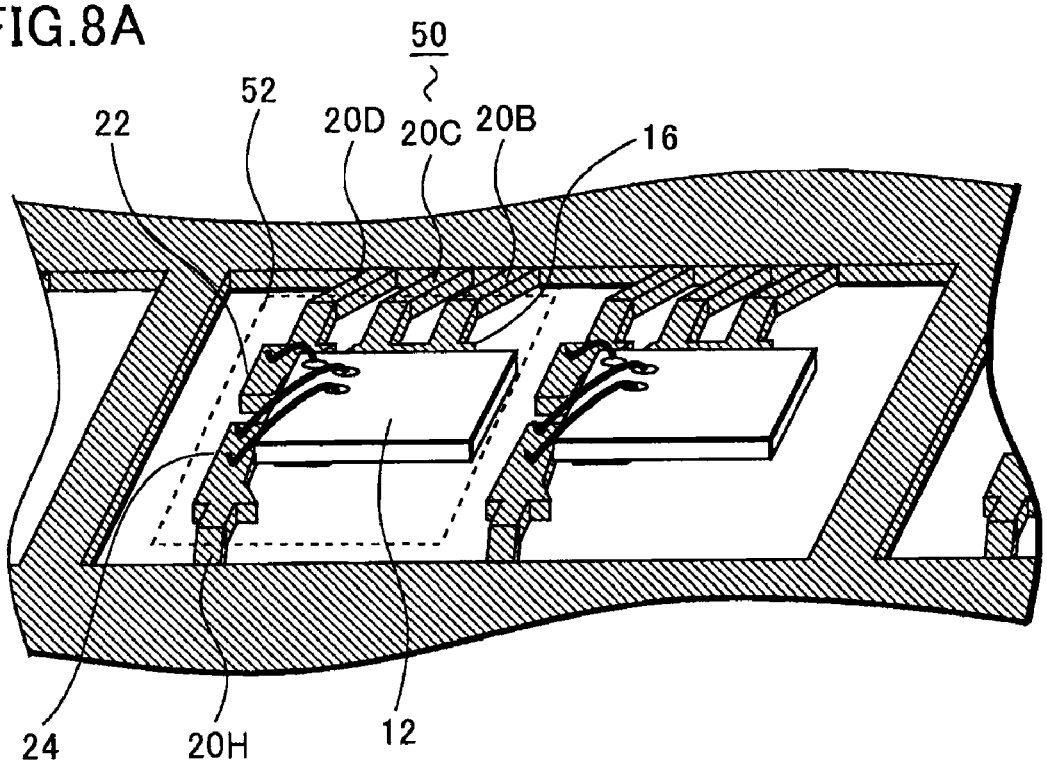
FIGS. 8A and 8B are perspective views showing a method of manufacturing the semiconductor devices of an embodiment of the present invention.
Figure 8B:
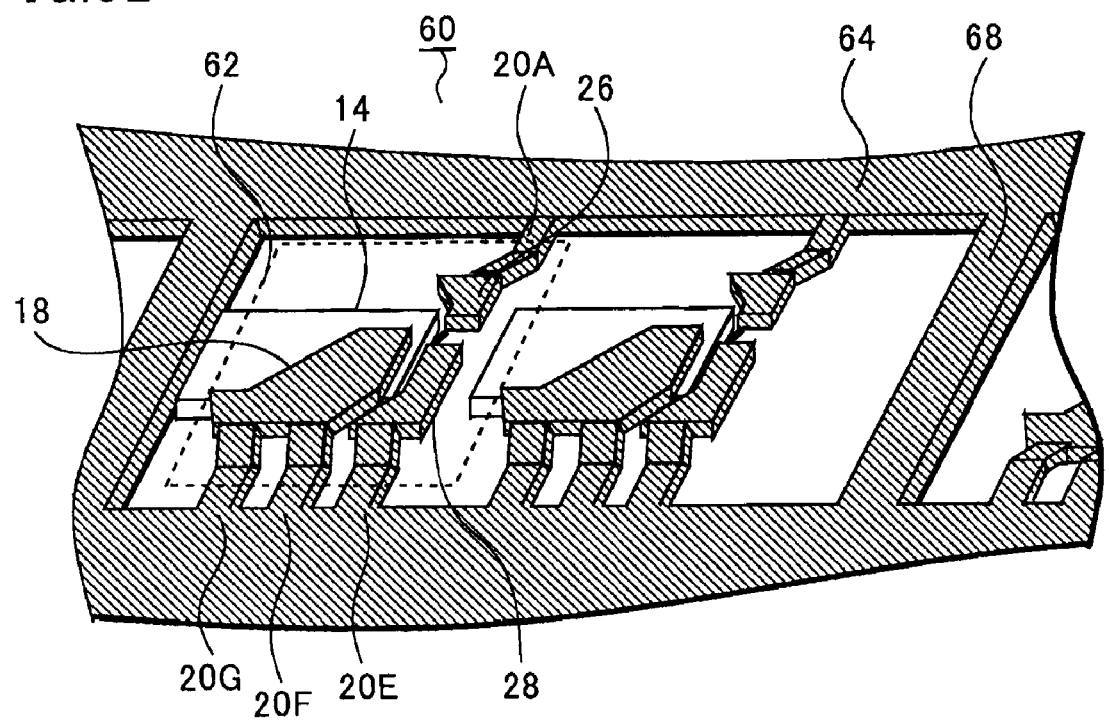

Subsequently, description will be given of the processes of the die-bonding and of the wire-bonding with reference to FIG. 8. FIG. 8A is a perspective view showing the unit 52 of the lead frame 50 in a state where the two processes are completed. FIG. 8B is a perspective view showing the unit 62 of the lead frame 60 in a similar state.

FIG. 8A shows that the first semiconductor element 12 is mounted on the top surface of the first island 16. The thin metallic wires are used to connect the electrodes formed on the top surface of the first semiconductor element 12 with the bonding portion 22 or the bonding portion 24. This process is carried out in a lump-sum manner on all the units 52 included the lead frame 50.

FIG. 8B shows that the second semiconductor element 14 is mounted on the bottom surface of the second island 18. The thin metallic wires—though they are not illustrated—are used to connect the electrodes formed on the bottom surface of the second semiconductor element 14 with the bottom surface of the bonding portion 26, or of the bonding portion 28. In the actual operation, this process is carried out with the lead frame 60 being placed upside down (in other words, the process is carried out in a state where the face on which the second semiconductor element 14 is mounted is made the top surface).

Once the above-described processes are finished, the lead frames 50 and 60 are overlaid and joined with each other. Accordingly, each unit of the joined lead frame thus produced has the structure shown in FIG. 1. In addition, a resin encapsulation process is carried out with each of the units of the lead frame being individually housed in a mold for molding. Specifically, in the process of resin encapsulation, the semiconductor elements, the islands the thin metallic wires and the leads are encapsulated with the encapsulating resin in each unit. The processes that follow are: a process of coating a plating film on the surface of the portions of the leads, which portions are exposed out of the encapsulating resin; a process of separating each encapsulated unit from the lead frame individually, a process of checking the quality and the electrical properties of each unit, a process of placing a seal, and the like. Thus, the semiconductor device 10 with the structure shown in FIG. 1 is completed.

Effects of the Invention

In the embodiments of the present invention, the first island on which the first semiconductor element is mounted and the second island on which the second semiconductor element is mounted are overlaid in a direction parallel to a side of the semiconductor elements. As a result, a steadier support can be provided for the semiconductor elements by the islands.

What is claimed is:

1. A semiconductor device comprising:
   a plurality of semiconductor elements stacked on one another; and
   leads electrically connected with the semiconductor elements, wherein parts of the leads are exposed out of the semiconductor device;
   a first island having a first main surface as a top surface and a second main surface as a bottom surface;
   a first lead having an end disposed at a position close to the first island;
   a first semiconductor element of the plurality of semiconductor elements, the first semiconductor element being fixed on the first main surface of the first island, wherein the first semiconductor element is electrically connected with the first lead;
   a second island having a first main surface as a bottom surface and a second main surface as a top surface;
   a second lead having an end disposed at a position close to the second island;
   a second semiconductor element of the plurality of semiconductor elements, the second semiconductor element being fixed on the first main surface of the second island, wherein the second semiconductor element is electrically connected with the second lead,
   wherein a portion of the first semiconductor element extends over an edge of the first island and overlaps the second island, a portion of the second semiconductor element extends over an edge of the second island and overlaps the first island, the second main surface of the first island is unattached to an opposing surface of the second semiconductor element, the second main surface of the second island is unattached to an opposing surface of the first semiconductor element, and a gap between the first island and the second semiconductor element and a gap between the second island and the first semiconductor element are filled with an encapsulating resin,
   wherein a first side surface of the first island overlaps a first side surface of the second island, when viewed from a first side surface of the semiconductor device, and
   a second side surface of the first island overlaps a second side surface of the second island when viewed from a second side surface of the semiconductor device, the second side surface of the semiconductor device being orthogonal to the first side surface of the semiconductor device; and
   electrodes on main surfaces of the two semiconductor elements,
   wherein each of the electrodes on the two semiconductor elements is within an area corresponding to the first island or the second island providing support for the semiconductor element on which the electrode is disposed.

2. The semiconductor device according to claim 1 wherein each of the first and the second islands has a triangular shape.

3. The semiconductor device according to claim 1 wherein the first and the second islands have identical shapes and are arranged symmetrically to each other within a plane.

4. The semiconductor device according to claim 1 wherein the first and the second islands are positioned so as to be shifted from each other in a thickness direction of the semiconductor device.

5. The semiconductor device according to claim 1 wherein a third side surface of the first island and a third side surface of the second island are overlaid with each other when viewed from a longer-side surface of the first and the second semiconductor elements.

6. The semiconductor device of claim 1 wherein a third side surface of the first island and a third side surface of the second island are overlaid, at least partially, with each other when viewed from a third side surface of the semiconductor device.

7. The semiconductor device according to claim 1 wherein each of the first and the second islands has a comb shape.

8. The semiconductor device according to claim 1 wherein each of the first and the second islands has a crank shape.

9. The semiconductor device according to claim 1 wherein the opposing surface of the second semiconductor element is a bottom surface of the second semiconductor element and the opposing surface of the first semiconductor element is a bottom surface of the first semiconductor element.

* * * * *